(12) United States Patent
Wang et al.

(10) Patent No.: US 12,159,908 B2
(45) Date of Patent: Dec. 3, 2024

(54) SEMICONDUCTOR DEVICE AND FABRICATION METHOD THEREOF

(71) Applicant: INNOSCIENCE (ZHUHAI) TECHNOLOGY CO., LTD., Zhuhai (CN)

(72) Inventors: Chao Wang, Zhuhai (CN); Ming-Hong Chang, Zhuhai (CN)

(73) Assignee: INNOSCIENCE (ZHUHAI) TECHNOLOGY CO., LTD., Zhuhai (CN)

( * ) Notice: Subject to any disclaimer, the term of this patent is extended or adjusted under 35 U.S.C. 154(b) by 1137 days.

(21) Appl. No.: 16/975,390

(22) PCT Filed: Jul. 7, 2020

(86) PCT No.: PCT/CN2020/100611
§ 371 (c)(1),
(2) Date: Aug. 24, 2020

(87) PCT Pub. No.: WO2022/006731
PCT Pub. Date: Jan. 13, 2022

(65) Prior Publication Data
US 2022/0376058 A1  Nov. 24, 2022

(51) Int. Cl.
*H01L 29/40* (2006.01)
*H01L 29/20* (2006.01)
(Continued)

(52) U.S. Cl.
CPC ........ *H01L 29/402* (2013.01); *H01L 29/2003* (2013.01); *H01L 29/401* (2013.01); *H01L 29/66462* (2013.01); *H01L 29/7786* (2013.01)

(58) Field of Classification Search
CPC . H01L 29/402; H01L 29/2003; H01L 29/401; H01L 29/66462; H01L 29/7786
See application file for complete search history.

(56) References Cited

U.S. PATENT DOCUMENTS

2015/0255547 A1* 9/2015 Yuan ................. H01L 29/66462
257/76
2015/0279722 A1 10/2015 Kikuchi
(Continued)

FOREIGN PATENT DOCUMENTS

| CN | 1639875 A | 7/2005 |
| CN | 101976686 A | 2/2011 |
| JP | 2014222724 A | 11/2014 |

OTHER PUBLICATIONS

International Search Report and Written Opinion of the corresponding PCT application No. PCT/CN2020/100611 mailed on Apr. 8, 2021.

*Primary Examiner* — Monica D Harrison
*Assistant Examiner* — Andre C Stevenson
(74) *Attorney, Agent, or Firm* — JCIPRNET

(57) ABSTRACT

A semiconductor device and a fabrication method thereof are provided. The semiconductor device includes a first nitride semiconductor layer, a second nitride semiconductor layer, a gate structure, and a field plate. The second nitride semiconductor layer is formed on a first surface of the first nitride semiconductor layer. The gate structure is disposed on the second nitride semiconductor layer. The field plate includes a first portion and a second portion connected to the first portion. The first portion has a first surface substantially in parallel to the first surface of the first nitride semiconductor layer, and a second surface adjacent to the first surface of the first portion. The first surface of the first portion of the field plate and the second surface of the first portion of the field plate define a first angle of about 90°.

16 Claims, 17 Drawing Sheets

(51) Int. Cl.
*H01L 29/66* (2006.01)
*H01L 29/778* (2006.01)

(56) References Cited

U.S. PATENT DOCUMENTS

2016/0181413 A1\* 6/2016 Fujita ................ H01L 29/66696
　　　　　　　　　　　　　　　　　　　　257/329
2021/0151592 A1\* 5/2021 Lee ....................... H01L 29/402

\* cited by examiner

SEMICONDUCTOR DEVICE AND FABRICATION METHOD THEREOF

BACKGROUND

1. Technical Field

The present disclosure relates to a semiconductor device and a fabrication method thereof, and more particularly to a semiconductor device including a field plate and a fabrication method thereof.

2. Description of the Related Art

Components including direct bandgap semiconductors, for example, semiconductor components including group III-V materials or group III-V compounds (Category: III-V compounds) can operate or work under a variety of conditions or in a variety of environments (e.g., at different voltages and frequencies) due to their characteristics.

The semiconductor components may include a heterojunction bipolar transistor (HBT), a heterojunction field effect transistor (HFET), a high-electron-mobility transistor (HEMT), a modulation-doped FET (MODFET) and the like.

SUMMARY

In some embodiments of the present disclosure, a semiconductor device is provided. The semiconductor device includes a first nitride semiconductor layer, a second nitride semiconductor layer, a gate structure, and a field plate. The first nitride semiconductor layer has a first surface. The second nitride semiconductor layer is formed on the first surface of the first nitride semiconductor layer and has a greater bandgap than that of the first nitride semiconductor layer. The gate structure is disposed on the second nitride semiconductor layer. The field plate includes a first portion and a second portion connected to the first portion. The first portion has a first surface substantially in parallel to the first surface of the first nitride semiconductor layer along a first direction, and a second surface adjacent to the first surface of the first portion. The first surface of the first portion of the field plate and the second surface of the first portion of the field plate define a first angle of about 90°.

In some embodiments of the present disclosure, a semiconductor device is provided. The semiconductor device includes a first nitride semiconductor layer, a second nitride semiconductor layer, a gate structure, and a field plate. The first nitride semiconductor layer has a first surface. The second nitride semiconductor layer is formed on the first surface of the first nitride semiconductor layer and has a greater bandgap than that of the first nitride semiconductor layer. The gate structure is disposed on the second nitride semiconductor layer. The field plate includes a first portion and a second portion connected to the first portion. The first portion has a first surface substantially in parallel to the first surface of the first nitride semiconductor layer along a first direction, a second surface opposite to the first surface, and a third surface extending between the first surface and the second surface. The third surface of the first portion includes a curved surface.

In some embodiments of the present disclosure, a method for manufacturing a semiconductor device is provided. The method includes forming a first nitride semiconductor layer having a first surface, and forming a second nitride semiconductor layer on the first surface of the first nitride semiconductor layer, the second nitride semiconductor layer having a greater bandgap than that of the first nitride semiconductor layer. The method for manufacturing a semiconductor device also includes forming a gate structure on the second nitride semiconductor layer, and forming a conductive material layer on the second nitride semiconductor layer and the gate structure. The method for manufacturing a semiconductor device further includes forming a mask layer over the conductive material layer, and forming a field plate by removing a portion of the conductive material layer.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may have arbitrarily increased or reduced for clarity of discussion.

DETAILED DESCRIPTION

Figure 1:
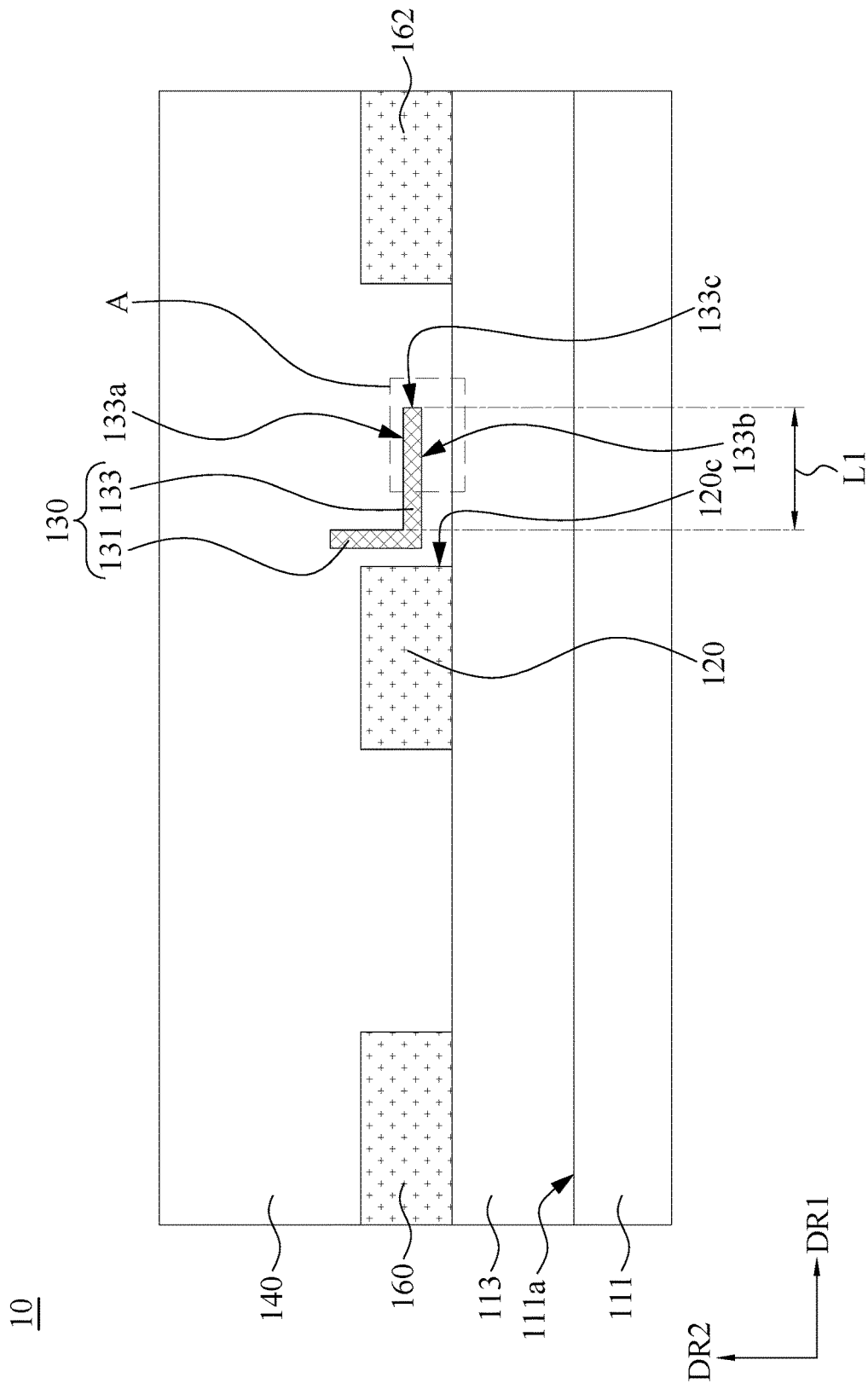
FIG. 1 is a cross-sectional view of a semiconductor device according to some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may have formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 is a cross-sectional view of a semiconductor device 10 according to some embodiments of the present disclosure. The semiconductor device 10 can work at a relatively great or high voltage level (e.g. greater than about 600 V). The semiconductor device 10 may function as a high voltage transistor. The semiconductor device 10 can work at a relatively great or high frequency (e.g. greater than about 6 GHz).

Referring to FIG. 1, the semiconductor device 10 may include a nitride semiconductor layer 111, a nitride semiconductor layer 113, a gate structure 120, a field plate 130, a dielectric structure 140, a source electrode 160, and a drain electrode 162.

The nitride semiconductor layer 111 may have formed on a substrate (not illustrated in FIG. 1). The substrate may include, without limitation, silicon (Si), doped Si, silicon carbide (SiC), germanium silicide (SiGe), gallium arsenide (GaAs), or other semiconductive materials. The substrate may include, without limitation, sapphire, silicon on insulator (SOI), or other suitable materials. The substrate may further include a doped region, for example, a p-well, an n-well, or the like.

The nitride semiconductor layer 111 may have a surface 111a. The nitride semiconductor layer 111 may include, without limitation, a group III nitride, for example, a compound $In_xAl_yGa_{1-x-y}N$, in which $x+y\leq 1$. The group III nitride may further include, but is not limited to, for example, a compound $Al_yGa_{(1-y)}N$, in which $y\leq 1$. For example, the nitride semiconductor layer 111 may include a GaN layer having a bandgap of about 3.4 eV.

The nitride semiconductor layer 113 may have formed on the surface 111a of the nitride semiconductor layer 111 and have a greater bandgap than that of the nitride semiconductor layer 111. The nitride semiconductor layer 113 may have in direct contact with the nitride semiconductor layer 111. The nitride semiconductor layer 113 may include, without limitation, a group III nitride, for example, a compound $In_xAl_yGa_{1-x-y}N$, in which $x+y\leq 1$. The group III nitride may further include, but is not limited to, for example, a compound $Al_yGa_{(1-y)}N$, in which $y\leq 1$. For example, the nitride semiconductor layer 113 may include AlGaN having a band gap of about 4 eV.

A heterojunction is formed between the nitride semiconductor layer 111 and the nitride semiconductor layer 113, e.g., at an interface of the nitride semiconductor layer 111 and the nitride semiconductor layer 113, and the polarization of the heterojunction of different nitrides forms a two-dimensional electron gas (2DEG) region (not illustrated in FIG. 1) adjacent to the interface of the nitride semiconductor layer 111 and the nitride semiconductor layer 113. The 2DEG region may have formed in the nitride semiconductor layer 111.

The gate structure 120 may have disposed on the nitride semiconductor layer 113. The gate structure 120 may include a gate conductive material. The gate conductive material may include, for example, but is not limited to, titanium (Ti), tantalum (Ta), tungsten (W), aluminum (Al), cobalt (Co), copper (Cu), nickel (Ni), platinum (Pt), lead (Pb), molybdenum (Mo) and compounds thereof (such as, but not limited to, titanium nitride (TiN), tantalum nitride (TaN), other conductive nitrides, or conductive oxides), metal alloys (such as aluminum-copper alloy (Al—Cu)), or other suitable materials. The 2DEG region (not illustrated in FIG. 1) may be formed under the gate structure 120 and preset to be in an ON state when the gate structure 120 is in a zero bias state. Such a device can be referred to as a depletion-mode device.

The source electrode 160 and the drain electrode 162 may be disposed over the nitride semiconductor layer 113. The gate structure 120 may be disposed between the source electrode 160 and the drain electrode 162. The source electrode 160 and the drain electrode 162 may independently include, for example, without limitation, a conductive material. The conductive materials may include, but are not limited to, for example, metals, alloys, doped semiconductor materials (e.g., doped crystalline silicon), or other suitable conductive materials.

The field plate 130 may be disposed over the nitride semiconductor layer 113. The field plate 130 may be disposed adjacent to the gate structure 120. The field plate 130 may be disposed between the gate structure 120 and the drain electrode 162. A thickness of the field plate 130 may range from about 50 nm to about 300 nm. The field plate 130 may be connected to the source electrode 160. The field plate 130 can be at zero potential and connected to the source electrode 160.

The field plate 130 may include a conductive material. The conductive material may include, for example, but is not limited to, titanium (Ti), tantalum (Ta), tungsten (W), aluminum (Al), cobalt (Co), copper (Cu), nickel (Ni), platinum (Pt), lead (Pb), molybdenum (Mo) and compounds thereof (such as, but not limited to, titanium nitride (TiN), tantalum nitride (TaN), other conductive nitrides, or conductive oxides), metal alloys (such as aluminum-copper alloy (Al—Cu)), or other suitable conductive materials.

The field plate 130 may not cover the gate structure 120 from a top view perspective. A projection of the gate structure 120 on the surface 111a of the nitride semiconductor layer 111 may not overlap a projection of the field plate 130 on the surface 111a of the nitride semiconductor layer 111. The field plate 130 may not be formed above the gate structure 120. The field plate 130 may not be formed directly above the gate structure 120.

The field plate 130 may include a portion 133 and a portion 131 connected to the portion 133. The portion 133 of the field plate 130 may extend along a direction DR1 substantially in parallel to the surface 111a of the nitride semiconductor layer 111. The portion 133 of the field plate 130 may have a length L1 along the direction DR1. The length L1 of the portion 133 of the field plate 130 may be about 200 nm or greater. The portion 131 of the field plate 130 may extend along a direction DR2 substantially perpendicular to the direction DR1. The portion 131 of the field plate 130 may extend along the direction DR2 and end in the direction DR2.

The portion 133 of the field plate 130 may have a surface 133a substantially in parallel to the surface 111a of the nitride semiconductor layer 111 along the direction DR1. The portion 133 of the field plate 130 may have a surface 133*b* substantially in parallel to the surface 111*a* of the nitride semiconductor layer 111 along the direction DR1. The surface 133*b* may be opposite to the surface 133*a* of the portion 133 of the field plate 130. The surface 133*b* of the portion 133 may be between the nitride semiconductor layer 113 and the surface 133*a* of the portion 133. The portion 133 of the field plate 130 may have a surface 133*c* adjacent to the surface 133*a* and the surface 133*b* of the portion 133. The surface 133*c* may be extending between the surface 133*a* and the surface 133*b* of the portion 133 of the field plate 130.

The dielectric structure 140 may be disposed over the nitride semiconductor layer 113. The dielectric structure 140 may be disposed on the gate structure 120. The dielectric structure 140 may be disposed on the source electrode 160. The dielectric structure 140 may be disposed on the drain electrode 162. The dielectric structure 140 may be disposed on the field plate 130. The field plate 130 may be spaced apart from the gate structure 120. The field plate 130 may be spaced apart from the gate structure 120 by the dielectric structure 140. The dielectric structure 140 may include silicon oxide, silicon nitride, aluminum oxide, aluminum nitride, and a combination thereof. For example, the dielectric structure 140 may include silicon nitride.

Figure 2A:
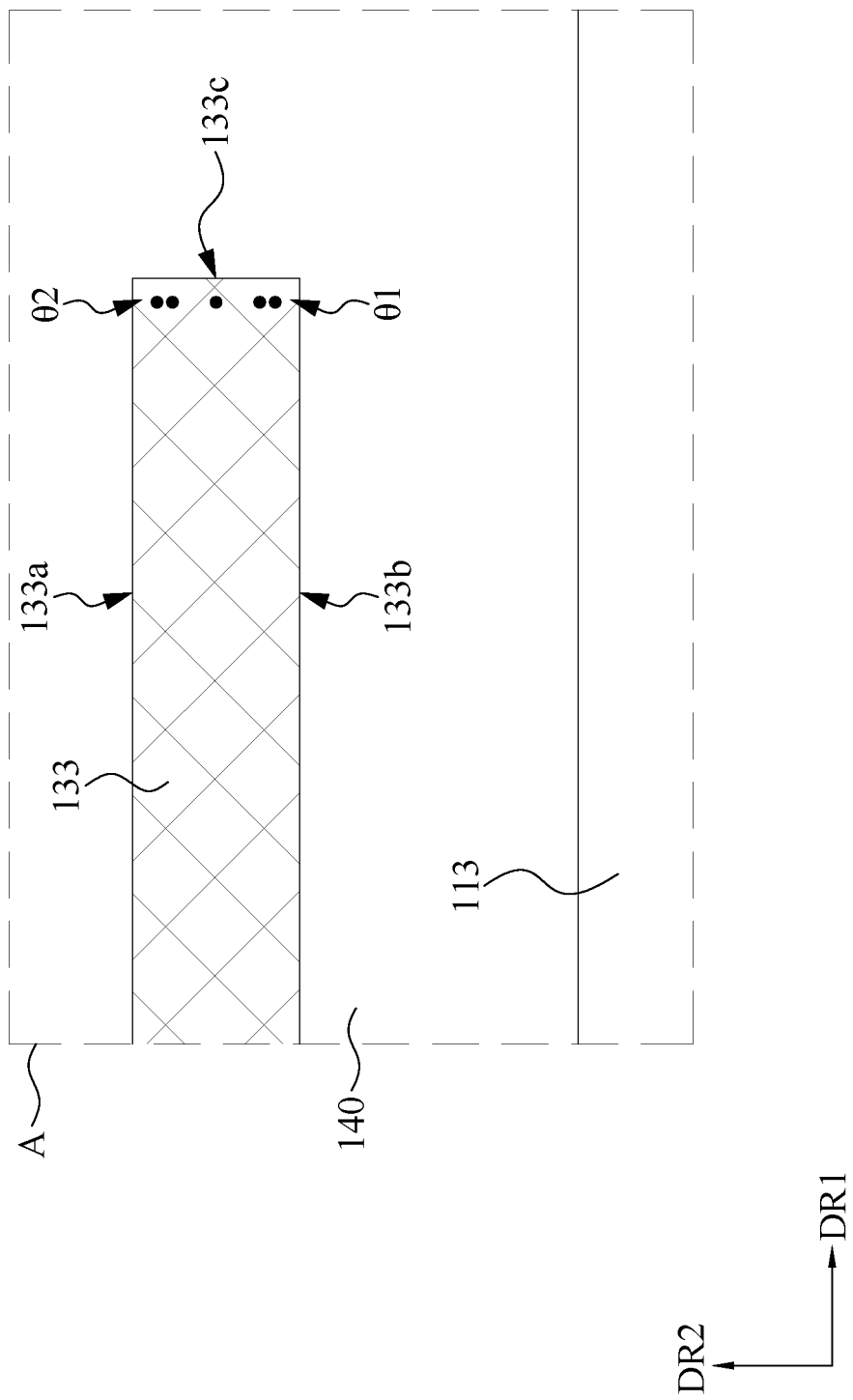
FIG. 2A is an enlarged view of the structure in the box A as shown in FIG. 1 according to some embodiments of the present disclosure.

FIG. 2A is an enlarged view of the structure in the box A in FIG. 1 according to some embodiments of the present disclosure.

The surface 133*b* of the portion 133 of the field plate 130 and the surface 133*c* of the portion 133 of the field plate 130 may define an angle θ1. The angle θ1 may be about 90°. The surface 133*a* of the portion 133 of the field plate 130 and the surface 133*c* of the portion 133 of the field plate 130 may define an angle θ2. The angle θ2 may be about 90°.

Figure 2B:
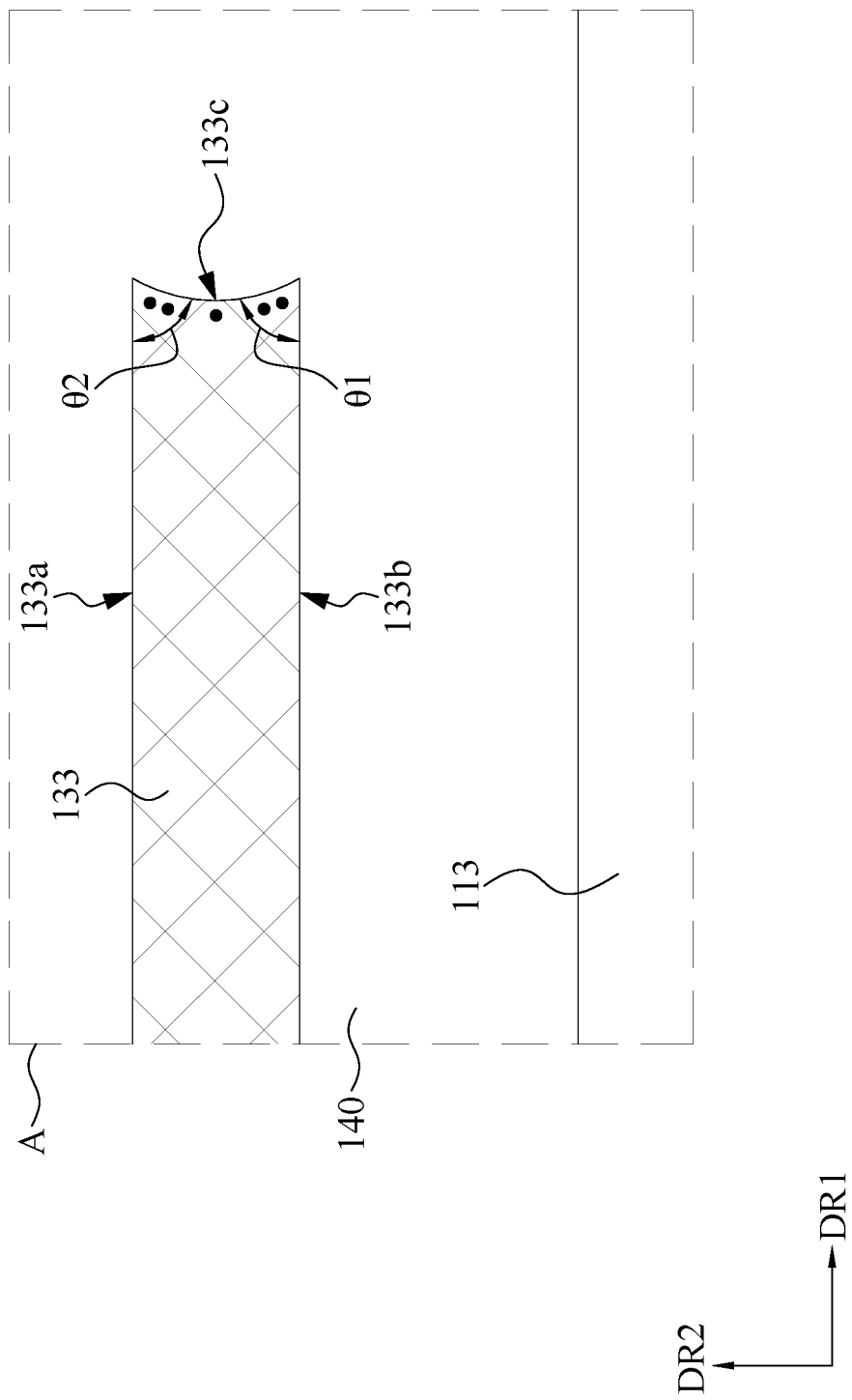
FIG. 2B is an enlarged view of the structure in the box A as shown in FIG. 1 according to some other embodiments of the present disclosure.

FIG. 2B is an enlarged view of the structure in the box A as shown in FIG. 1 according to some other embodiments of the present disclosure.

The surface 133*c* of the portion 133 of the field plate 130 may have or include a curved surface. The surface 133*c* of the portion 133 of the field plate 130 may have or include a concave surface. The surface 133*c* of the portion 133 of the field plate 130 may have a concave surface extending towards the portion 133 of the field plate 130.

The surface 133*b* of the portion 133 of the field plate 130 and the surface 133*c* of the portion 133 of the field plate 130 may define an angle θ1. The angle θ1 may range from about 75° to about 90°. The angle θ1 may range from about 80° to about 90°. The angle θ1 may range from about 85° to about 90°. The surface 133*a* of the portion 133 of the field plate 130 and the surface 133*c* of the portion 133 of the field plate 130 may define an angle θ2. The angle θ2 may range from about 75° to about 90°. The angle θ2 may range from about 80° to about 90°. The angle θ2 may range from about 85° to about 90°.

Referring to FIG. 2A and FIG. 2B, charges may be represented by black dots. The charges may be positive charges or negative charges. The charges can appear, locate or occur at the surface of a conductor. The charges can appear, locate or occur adjacent to the surface of a conductor. The charges can appear, locate or occur at the inner surface of a conductor. The charges can appear, locate or occur adjacent to the inner surface of a conductor. The charges can appear, locate or occur at the surface of the field plate 130. The charges can appear, locate or occur adjacent to the surface of the field plate 130. The charges can appear, locate or occur at the surface of the gate structure 120. The charges can appear, locate or occur adjacent to the surface of the gate structure 120. The charges may be concentrated at an edge of the gate structure 120. The charges may be accumulated at an edge of the gate structure 120. The charges may be concentrated at an edge of the field plate 130. The charges may be accumulated at an edge of the field plate 130. The angle θ2 is relatively large enough so that the charges may not be accumulated at the location between the surface 133*b* and the surface 133*c*. The angle θ2 is relatively large enough so that the charges may not be accumulated at the edge between the surface 133*b* and the surface 133*c*. The angle θ1 is relatively large enough so that the charges may not be accumulated at the location between the surface 133*a* and the surface 133*c*. The angle θ1 is relatively large enough so that the charges may not be accumulated at the edge between the surface 133*a* and the surface 133*c*. The angle θ1 is relatively large enough so that the charges may appear, locate or occur adjacent to the surface 133*c* of the portion 133 of the field plate 130. Therefore, the voltage endurance of the semiconductor device 10 may be improved. Accordingly, the breakdown voltage of the semiconductor device 10 can be increased.

The surface 133*c* of the portion 133 of the field plate 130 may have or include a curve surface. The surface 133*c* of the portion 133 of the field plate 130 may have or include a concave surface. The charges may appear, locate or occur adjacent to the surface 133*c* and may not be accumulated at a point end. Thus, a relatively high electric field can be avoided. Thus, the electric field may appear, locate or occur uniformly between the gate structure 120 and the drain electrode 162. Thus, the electric field may appear, locate or occur uniformly between the gate structure 120 and the drain electrode 162 when a bias is applied to the drain electrode 162. The electric field may appear, locate or occur uniformly between the gate structure 120 and the drain electrode 162 when a bias is applied to the gate structure 120.

The field plate 130 does not have a point end. Thus, a relatively high electric field due to a point end of the field plate 130 can be avoided. Thus, the electric field among the region between the gate structure 120 and the drain electrode 162 can be relatively uniform. Accordingly, the breakdown voltage of the semiconductor device 10 can be further increased.

The angle θ1 defined by a lower surface (i.e., the surface 133*b*) and a lateral surface (i.e., the surface 133*c*) of the portion 133 of the field plate 130 may range from about 75° to about 90°. Thus, a relatively high electric field that could have been easily caused by a point end of the field plate 130 can be avoided. Thus, the electric field among the region between the gate structure 120 and the drain electrode 162 can be relatively uniform. Accordingly, the breakdown voltage of the semiconductor device 10 can be further increased.

The field plate 130 may not be formed above the gate structure 120. As such, the parasitic capacitance formed from the gate structure 120, the 2DEG region below the gate structure 120, and the field plate 130 can be relatively small, and thus the adverse effects of parasitic capacitance on the device performance can be prevented effectively.

Figure 3:
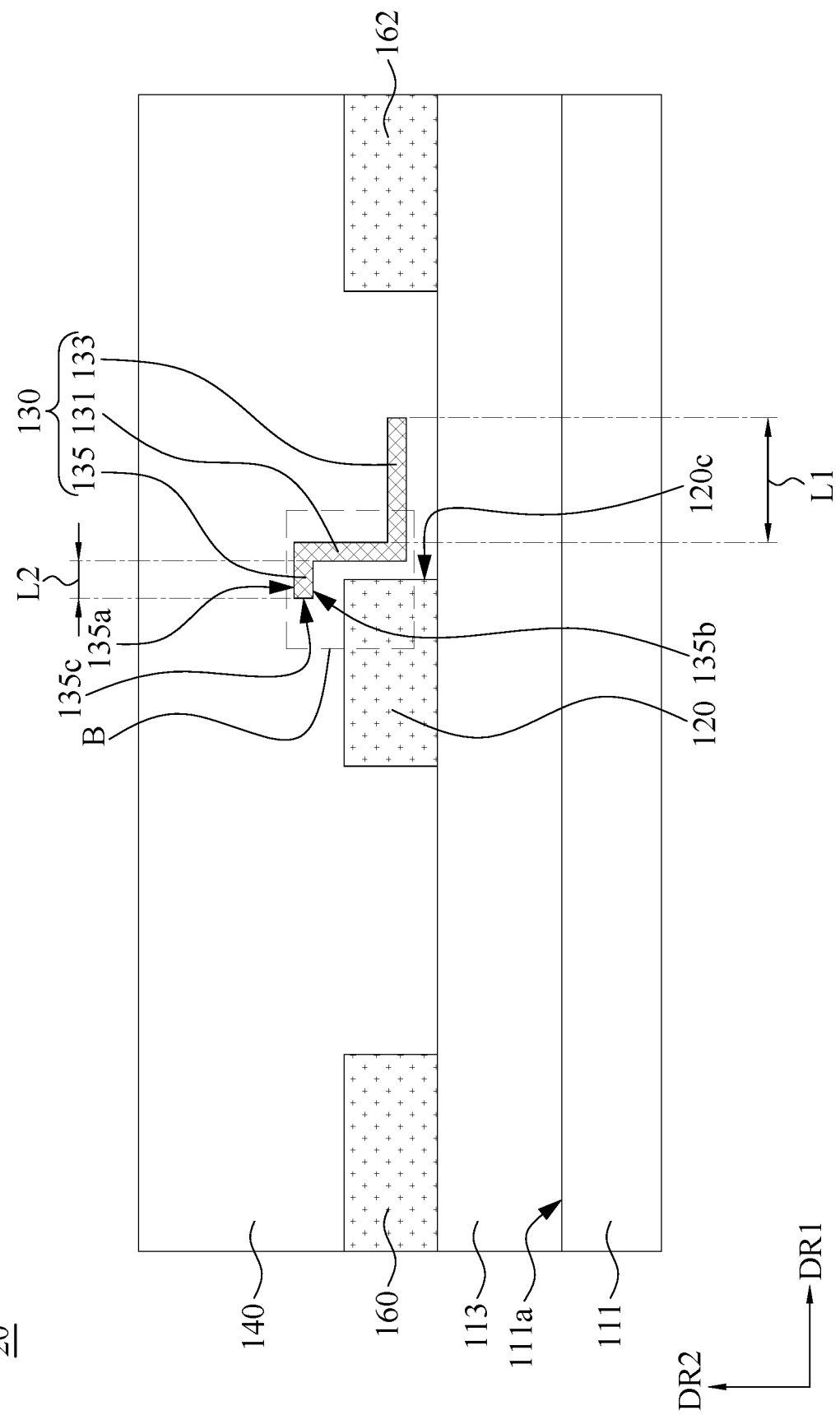
FIG. 3 is a cross-sectional view of a semiconductor device according to some embodiments of the present disclosure.

FIG. 3 is a cross-sectional view of a semiconductor device 20 according to some embodiments of the present disclosure. The semiconductor device 20 may have a structure similar to the semiconductor device 10 shown in FIG. 1, but differs in that, for example, the field plate 130 may have a different structure.

The field plate 130 may further include a portion 135 above the gate structure 120. The portion 135 of the field plate 130 may extend along the direction DR1. The portion 135 of the field plate 130 may be connected to the portion 131 of the field plate 130. The length L1 of the portion 133 of the field plate 130 along the direction DR1 may be greater than a length L2 of the portion 135 of the field plate 130 along the direction DR1. The length L2 of the portion 135 of the field plate 130 may be less than 100 nm.

The portion 135 of the field plate 130 may cover the gate structure 120 from a top view perspective. The portion 135 of the field plate 130 may partially cover the gate structure 120 from a top view perspective. A projection of the gate structure 120 on the surface 111a of the nitride semiconductor layer 111 may overlap a portion of the portion 135 of the field plate 130 on the surface 111a of the nitride semiconductor layer 111.

The portion 135 of the field plate 130 may have a surface 135a substantially in parallel to the surface 111a of the nitride semiconductor layer 111 along the direction DR1. The portion 135 of the field plate 130 may have a surface 135b substantially in parallel to the surface 111a of the nitride semiconductor layer 111 along the direction DR1. The surface 135b may be opposite to the surface 135a of the portion 135 of the field plate 130. The surface 135b of the portion 135 may be between the nitride semiconductor layer 113 and the surface 135a of the portion 135. The portion 135 of the field plate 130 may have a surface 135c adjacent to the surface 135a and the surface 135b of the portion 135. The surface 135c may extend between the surface 135a and the surface 135b of the portion 135 of the field plate 130.

Figure 3A:
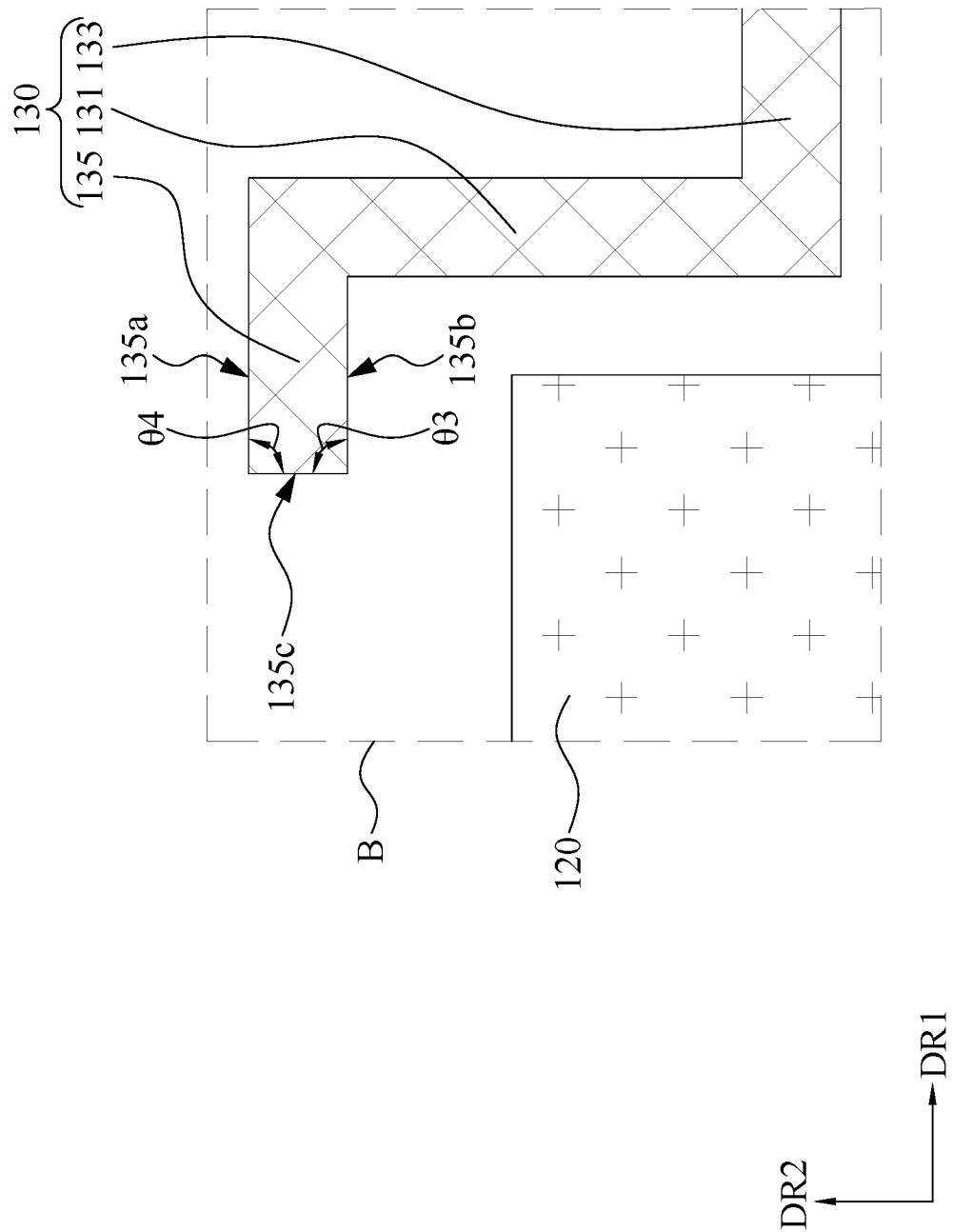
FIG. 3A is an enlarged view of the structure in the box B as shown in FIG. 3 according to some embodiments of the present disclosure.

FIG. 3A is an enlarged view of the structure in the box B as shown in FIG. 3 according to some embodiments of the present disclosure.

The surface 135b of the portion 135 of the field plate 130 and the surface 135c of the portion 135 of the field plate 130 may define an angle θ3. The angle θ3 may be about 90°. The surface 135a of the portion 135 of the field plate 130 and the surface 135c of the portion 135 of the field plate 130 may define an angle θ4. The angle θ4 may be about 90°.

Figure 3B:
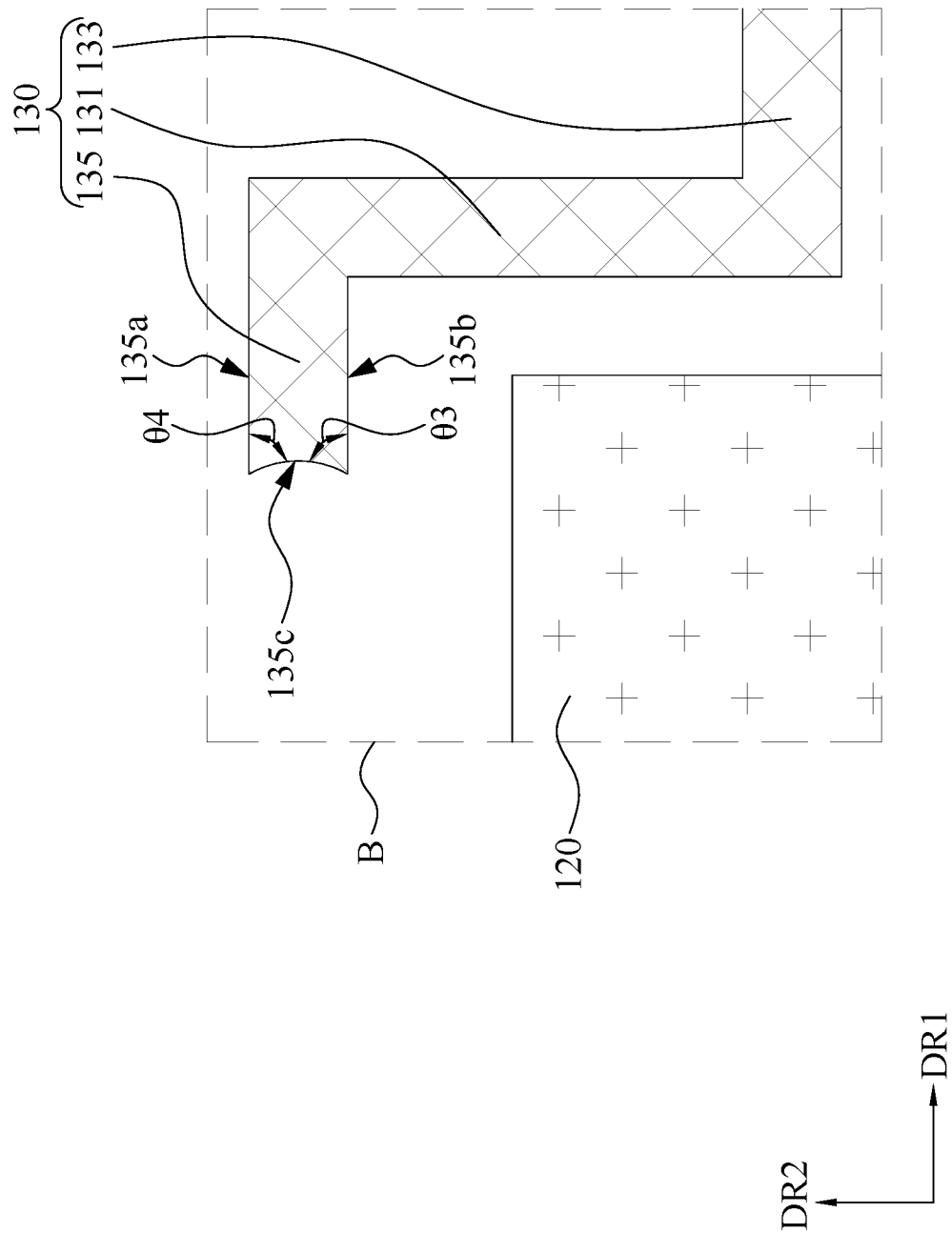
FIG. 3B is an enlarged view of the structure in the box B as shown in FIG. 3 according to some other embodiments of the present disclosure.

FIG. 3B is an enlarged view of the structure in the box B as shown in FIG. 3 according to some other embodiments of the present disclosure The surface 135c of the portion 135 of the field plate 130 may have or include a curved surface. The surface 135c of the portion 135 of the field plate 130 may have or include a concave surface. The surface 135c of the portion 135 of the field plate 130 may have a concave surface extending towards the portion 135 of the field plate 130.

The surface 135b of the portion 135 of the field plate 130 and the surface 135c of the portion 135 of the field plate 130 may define an angle θ3. The angle θ3 may range from about 75° to about 90°. The angle θ3 may range from about 80° to about 90°. The angle θ3 may range from about 85° to about 90°. The surface 135a of the portion 135 of the field plate 130 and the surface 135c of the portion 135 of the field plate 130 may define an angle θ4. The angle θ4 may range from about 75° to about 90°. The angle θ4 may range from about 80° to about 90°. The angle θ4 may range from about 85° to about 90°.

The angle θ3 defined by a lower surface (i.e., the surface 135b) and a lateral surface (i.e., the surface 135c) of the portion 135 of the field plate 130 may range from about 75° to about 90°. Thus, a relatively high electric field that could have been easily caused by a point end of the field plate 130 can be avoided. Thus, the electric field adjacent to the gate structure 120 can be relatively uniform. Accordingly, the breakdown voltage of the semiconductor device 20 can be further increased.

The length L2 of the portion 135 of the field plate 130 above the gate structure 120 may be less than 100 nm. As such, the parasitic capacitance formed from the gate structure 120, the 2DEG below the gate structure 120, and the portion 135 of the field plate 130 can be relatively small. Therefore, the adverse effects of parasitic capacitance on the device performance can be reduced effectively.

Figure 4:
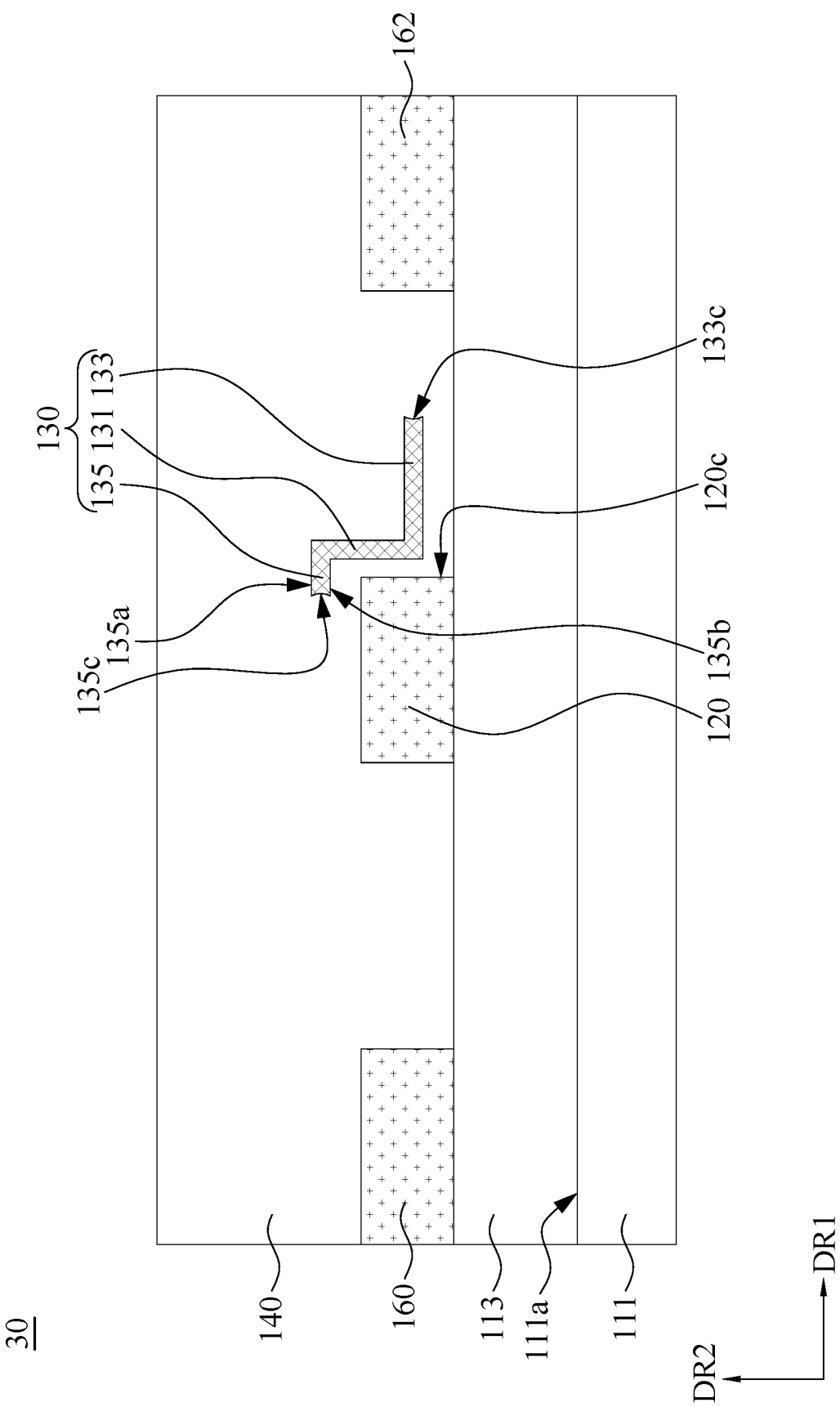
FIG. 4 is a cross-sectional view of a semiconductor device according to some embodiments of the present disclosure.

FIG. 4 is a cross-sectional view of a semiconductor device 30 according to some embodiments of the present disclosure. The semiconductor device 30 has a structure similar to the semiconductor device 10 shown in FIG. 1, but differs in that, for example, the field plate 130 may have a different structure.

The portion 135 of the field plate 130 may have a surface 135c facing the source electrode 160. The portion 133 of the field plate 130 may have a surface 133c facing the drain electrode 162. The surface 135c of the portion 135 and the surface 133c of the portion 133 may have or include curved surfaces. The surface 135c of the portion 135 and the surface 133c of the portion 133 may have or include concave surfaces. The surface 135c of the portion 135 may have a concave surface extending towards the field plate 130. The surface 133c of the portion 133 may have a concave surface extending towards the field plate 130.

Figure 5:
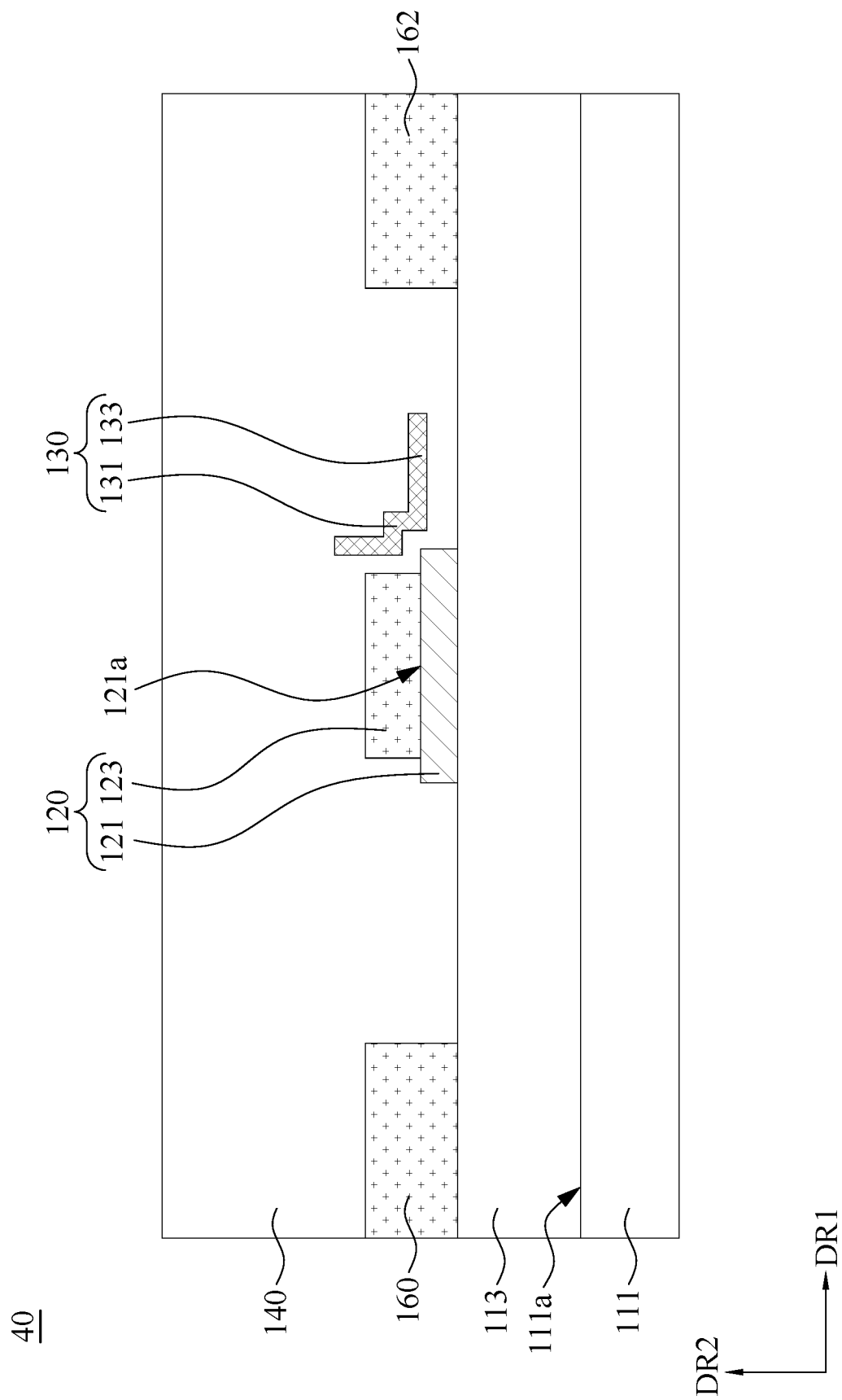
FIG. 5 is a cross-sectional view of a semiconductor device according to some embodiments of the present disclosure.

FIG. 5 is a cross-sectional view of a semiconductor device 40 according to some embodiments of the present disclosure. The semiconductor device 40 has a structure similar to the semiconductor device 10 shown in FIG. 1, but differs in that, for example, the gate structure 120 may have a different structure, and the field plate 130 may have a different structure.

The gate structure 120 may include a doped group III-V semiconductor layer 121 and a gate layer 123. The doped group III-V semiconductor layer 121 may be disposed over the nitride semiconductor layer 113. The doped group III-V semiconductor layer 121 may be in direct contact with the nitride semiconductor layer 113. The gate layer 123 may be disposed over the doped group III-V semiconductor layer 121. The gate layer 123 may directly contact a surface 121a of the doped group III-V semiconductor layer 121. The field plate 130 may cover a portion of the doped group III-V semiconductor layer 121 and expose the gate layer 123 from a top view perspective. The 2DEG region (not illustrated in FIG. 5) may be formed under the doped group III-V semiconductor layer 121 and preset to be in an OFF state when the gate structure 120 is in a zero bias state. Such a device can be referred to as an enhancement-mode device.

The field plate 130 may not cover the gate layer 123 from a top view perspective. A projection of the gate layer 123 on the surface 111a of the nitride semiconductor layer 111 may not overlap a projection of the field plate 130 on the surface 111a of the nitride semiconductor layer 111.

The portion 131 of the field plate 130 may cover the doped group III-V semiconductor layer 121 of the gate structure 120 from a top view perspective. The portion 131 of the field plate 130 may partially cover the doped group III-V semiconductor layer 121 of the gate structure 120 from a top view perspective. A projection of the doped group III-V semiconductor layer 121 of the gate structure 120 on the surface 111a of the nitride semiconductor layer 111 may overlap a portion of the portion 131 of the field plate 130 on the surface 111a of the nitride semiconductor layer 111. The portion 131 of the field plate 130 may have a stepped structure.

Figure 6:
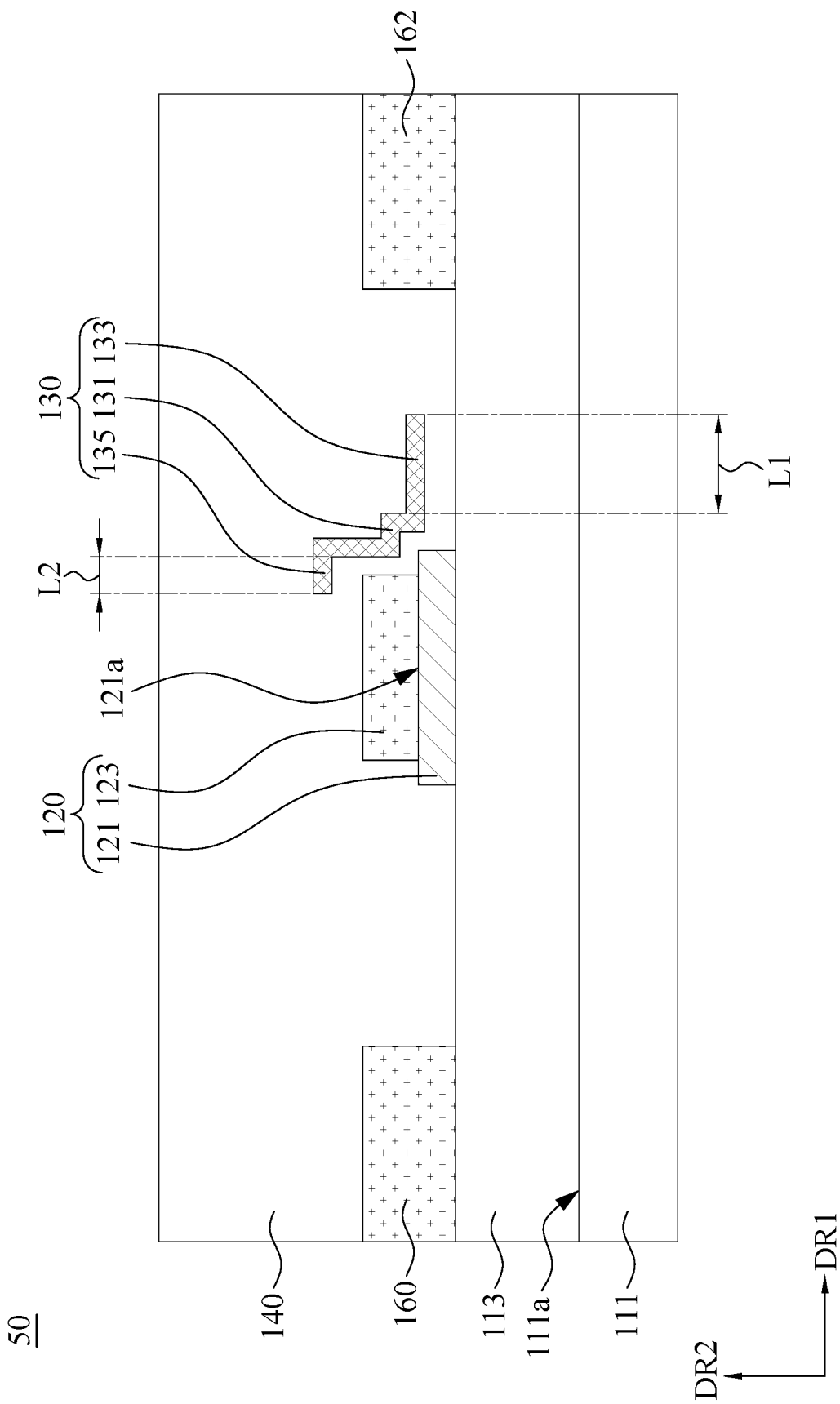
FIG. 6 is a cross-sectional view of a semiconductor device according to some embodiments of the present disclosure.

FIG. 6 is a cross-sectional view of a semiconductor device 50 according to some embodiments of the present disclosure. The semiconductor device 50 has a structure similar to the semiconductor device 40 shown in FIG. 5, but differs in that, for example, the field plate 130 may have a different structure.

The field plate 130 may cover a portion of the doped group III-V semiconductor layer 121 and a portion of the gate layer 123 from a top view perspective. The portion 135 of the field plate 130 may cover a portion of the doped group III-V semiconductor layer 121 and a portion of the gate layer 123 from a top view perspective. The portion 131 of the field plate 130 may cover a portion of the doped group III-V semiconductor layer 121 and expose the gate layer 123 from a top view perspective.

FIGS. 7A, 7B, 7C and 7D illustrate some operations to manufacture a semiconductor device according to some embodiments of the present disclosure.

Figure 7A:
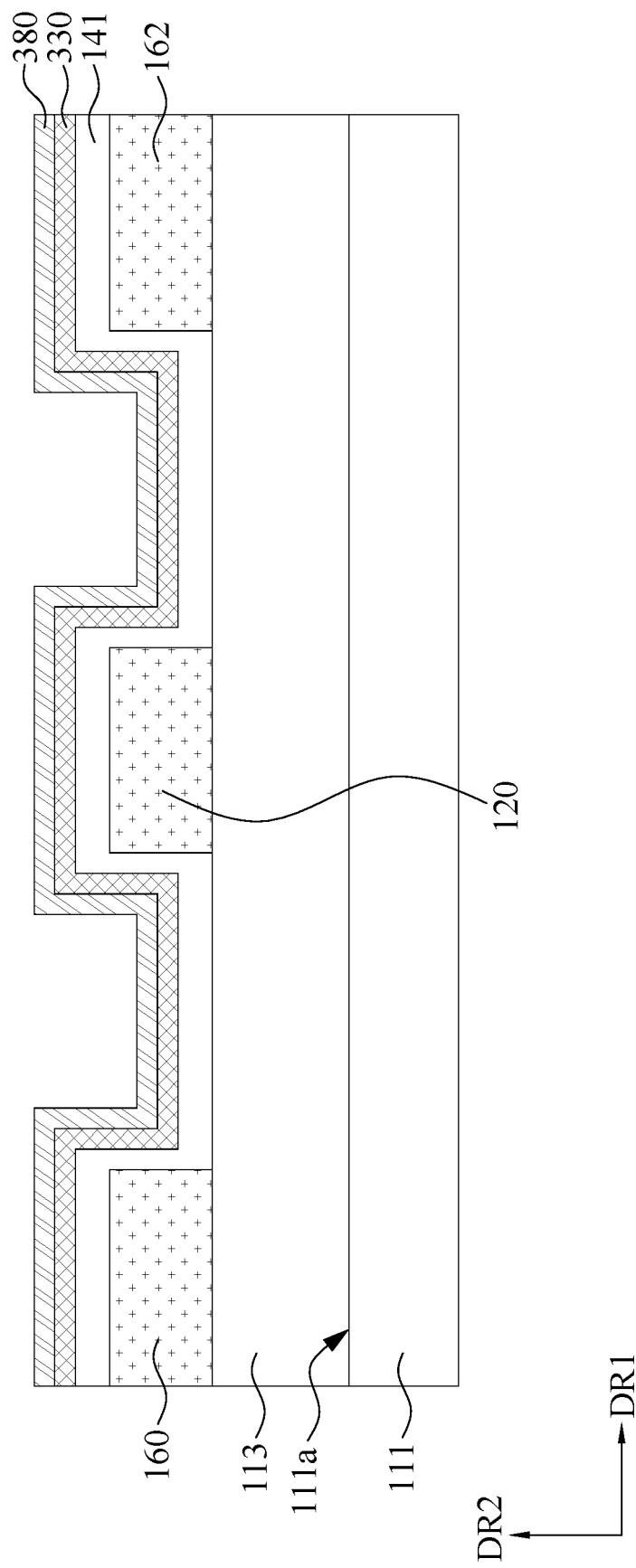
FIGS. 7A, 7B, 7C and 7D illustrate some operations to manufacture a semiconductor device according to some embodiments of the present disclosure.

Referring to FIG. 7A, a nitride semiconductor layer 111 is formed, and a nitride semiconductor layer 113 is formed on a surface 111a of the nitride semiconductor layer 111. The nitride semiconductor layer 113 may have a greater bandgap than that of the nitride semiconductor layer 111. The nitride semiconductor layer 113 may be formed on and in direct contact with the nitride semiconductor layer 111. The nitride semiconductor layers 111 and 113 may be formed by epitaxial growth.

Still referring to FIG. 7A, a gate structure 120, a source electrode 160, and a drain electrode 162 are formed over the nitride semiconductor layer 113. The gate structure 120, the source electrode 160, and the drain electrode 162 can be formed by physical vapor deposition (PVD), chemical vapor deposition (CVD), atomic layer deposition (ALD), plating, and/or other suitable deposition steps.

Still referring to FIG. 7A, a conductive material layer 330 is formed on the nitride semiconductor layer 113 and the gate structure 120. The conductive material layer 330 may be formed conformally on the gate structure 120. The conductive material layer 330 can be formed by PVD, CVD, ALD, plating, and/or other suitable deposition steps. The conductive material layer 330 may include titanium (Ti), tantalum (Ta), tungsten (W), aluminum (Al), cobalt (Co), copper (Cu), nickel (Ni), platinum (Pt), lead (Pb), molybdenum (Mo) and compounds thereof (such as, but not limited to, titanium nitride (TiN), tantalum nitride (TaN), other conductive nitrides, or conductive oxides), metal alloys (such as aluminum-copper alloy (Al—Cu)), or other suitable conductive materials. For example, the conductive material layer 330 may include TiN.

A dielectric structure 141 may be formed on the nitride semiconductor layer 113, and the conductive material layer 330 may be formed on the dielectric structure 141. The dielectric structure 141 may be formed before forming the conductive material layer 330. The dielectric structure 141 may be formed conformally on the gate structure 120. The conductive material layer 330 may be formed conformally on the dielectric structure 141. The dielectric structure 141 may include silicon oxide, silicon nitride, aluminum oxide, aluminum nitride, and a combination thereof. For example, the dielectric structure 141 may include silicon nitride. The dielectric structure 141 may be formed by a deposition process. The dielectric structure 141 may be formed by a plasma-enhanced CVD (PECVD) process or a low-pressure CVD (LPCVD) process.

Still referring to FIG. 7A, a mask layer 380 is formed over the conductive material layer 330. The mask layer 380 may be formed conformally on the conductive material layer 330. The mask layer 380 may have or include a dielectric material. The mask layer 380 and the dielectric structure 141 may have or include different materials. The mask layer 380 may include silicon oxide, silicon nitride, aluminum oxide, aluminum nitride, and a combination thereof. For example, the mask layer 380 may include silicon oxide.

Figure 7B:
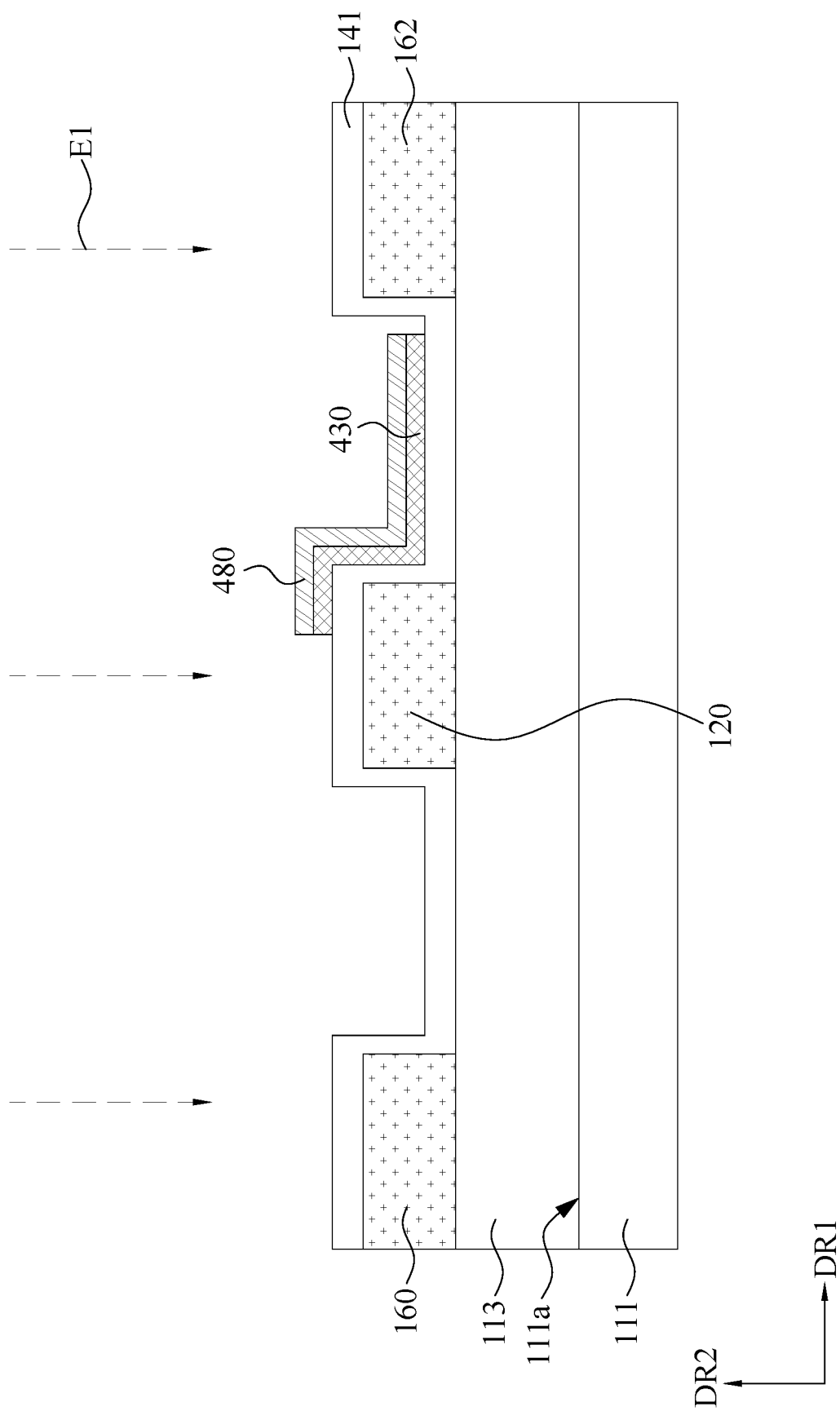

Referring to FIG. 7B, a mask layer 480 may be formed. The mask layer 480 may be formed by removing a portion of the mask layer 380 shown in FIG. 7A. The mask layer 480 may have a predetermined pattern. The mask layer 480 may be formed by photolithography and etching. The mask layer 480 may cover a portion of the gate structure 120 from a top view perspective. The mask layer 480 may cover a portion of the nitride semiconductor layer 113 from a top view perspective. The mask layer 480 may cover a portion of the nitride semiconductor layer 113 which may be located between the gate structure 120 and the drain electrode 162 from a top view perspective.

Still referring to FIG. 7B, a conductive material layer 430 may be formed. The conductive material layer 430 may be formed by removing a portion of the conductive material layer 330 shown in FIG. 7A. The conductive material layer 430 may have a pattern that is substantially the same as the predetermined pattern of the mask layer 480. For example, a dry etch process E1 may be performed on the conductive material layer 330 shown in FIG. 7A to form the conductive material layer 430. As illustrated in FIG. 7B, after the dry etch process E1 is performed, an edge of the conductive material layer 430 may be substantially aligned with an edge of the mask layer 480. After the dry etch process E1 is performed, the conductive material layer 430 may be covered by the mask layer 480. After the dry etch process E1 is performed, the conductive material layer 430 may be capped with the mask layer 480.

The dry etch process E1 may have an etching selectivity ratio of the conductive material layer 430 to the dielectric structure 141 that may be 1:10 or higher. The dry etch process E1 may have an etching selectivity ratio of the conductive material layer 430 to the dielectric structure 141 that may preferably range from about 1:10 to about 1:1.

Figure 7C:
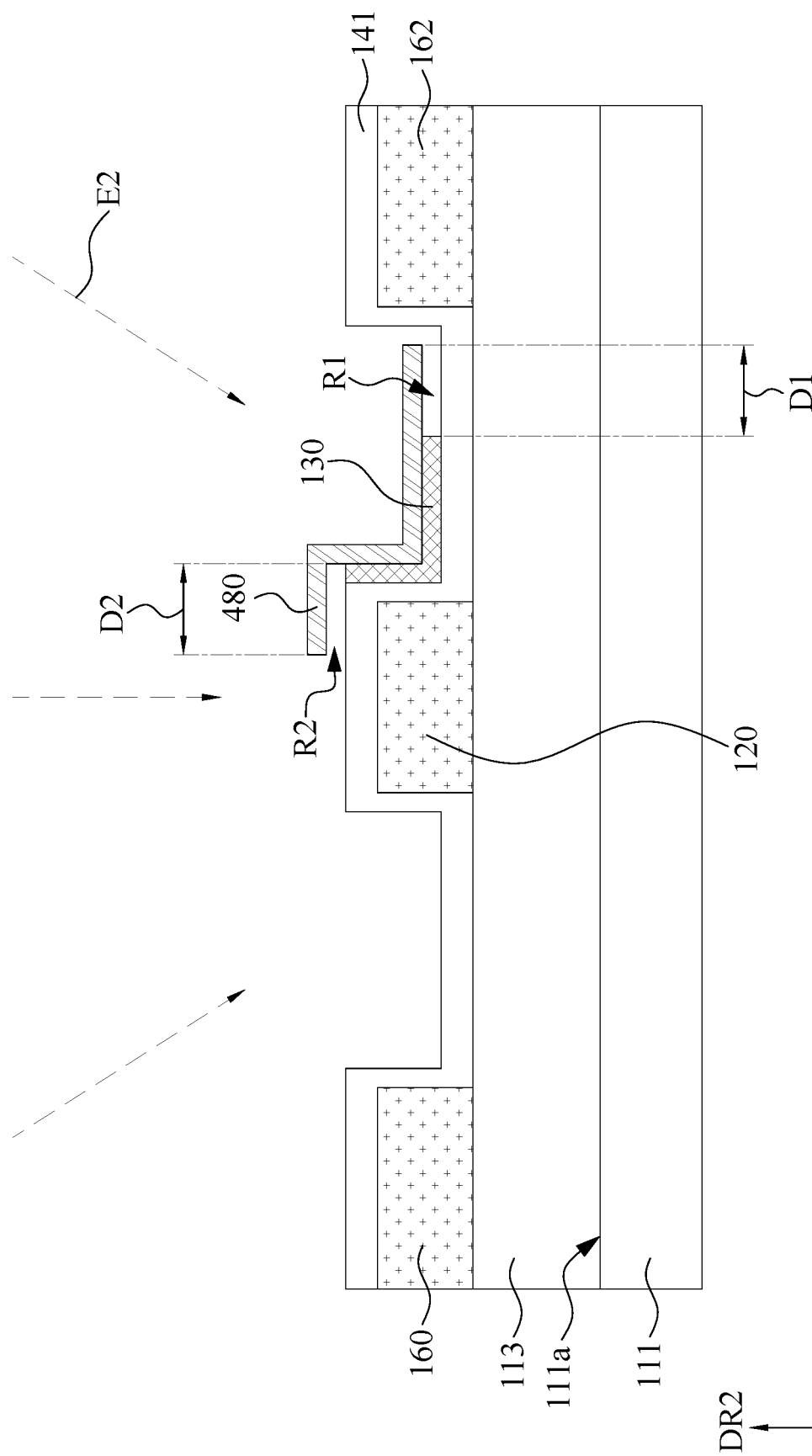

Referring to FIG. 7C, a field plate 130 may be formed. The field plate 130 may be formed by removing a portion of the conductive material layer 430 shown in FIG. 7B. For example, a wet etch process E2 may be performed on the conductive material layer 430 shown in FIG. 7B. The wet etch process E2 may be performed on the conductive material layer 430 shown in FIG. 7B after the dry etch process E1 is performed. The wet etch process E2 may be performed to form the field plate 130. The wet etch process E2 may be performed to remove portions of the conductive material layer 430 shown in FIG. 7B. As illustrated in FIG. 7C, after the wet etch process E2 is performed, an edge of the field plate 130 (e.g., the etched conductive material layer 430) is located inside an edge of the mask layer 480 from a top view perspective. After the dry etch process E2 is performed, the field plate 130 may be covered by the mask layer 480. After the dry etch process E2 is performed, the field plate 130 may be capped with the mask layer 480.

A recess R1 may be formed. A recess R2 may be formed. The recess R1 and the recess R2 may be formed by the wet etch process E2. A portion of the conductive material layer 430 shown in FIG. 7B under the mask layer 480 adjacent to the drain electrode 162 may be removed by the wet etch process E2 to form the recess R1. The recess R1 may have a depth D1. The recess R1 may have a depth D1 along the direction DR1. A portion of the conductive material layer 430 shown in FIG. 7B under the mask layer 480 adjacent to the gate structure 120 may be removed by the wet etch process E2 to form the recess R2. The recess R2 may have a depth D2. The recess R2 may have a depth D2 along the direction DR1. The depth D1 of the recess R1 may be substantially the same as the depth D2 of the recess R2. The depth D1 of the recess R1 and the depth D2 of the recess R2 may be adjusted by the wet etch process E2. The depth D1 of the recess R1 and the depth D2 of the recess R2 may be adjusted by a duration of the wet etch process E2.

The wet etch process E2 may have an etching selectivity ratio of the field plate 130 to the mask layer 480 that may be 10:1 or higher. The wet etch process E2 may have an etching selectivity ratio of the field plate 130 to the mask layer 480 that may preferably range from about 10:1 to about 100:1. The wet etch process E2 may have an etching selectivity ratio of the field plate 130 to the dielectric structure 141 that may be 10:1 or higher. The wet etch process E2 may have an etching selectivity ratio of the field plate 130 to the dielectric structure 141 that may preferably range from about 10:1 to about 50:1. Performing the wet etch process E2 may include applying an ammonia solution, a hydrogen peroxide solution, or a combination thereof.

Figure 7D:
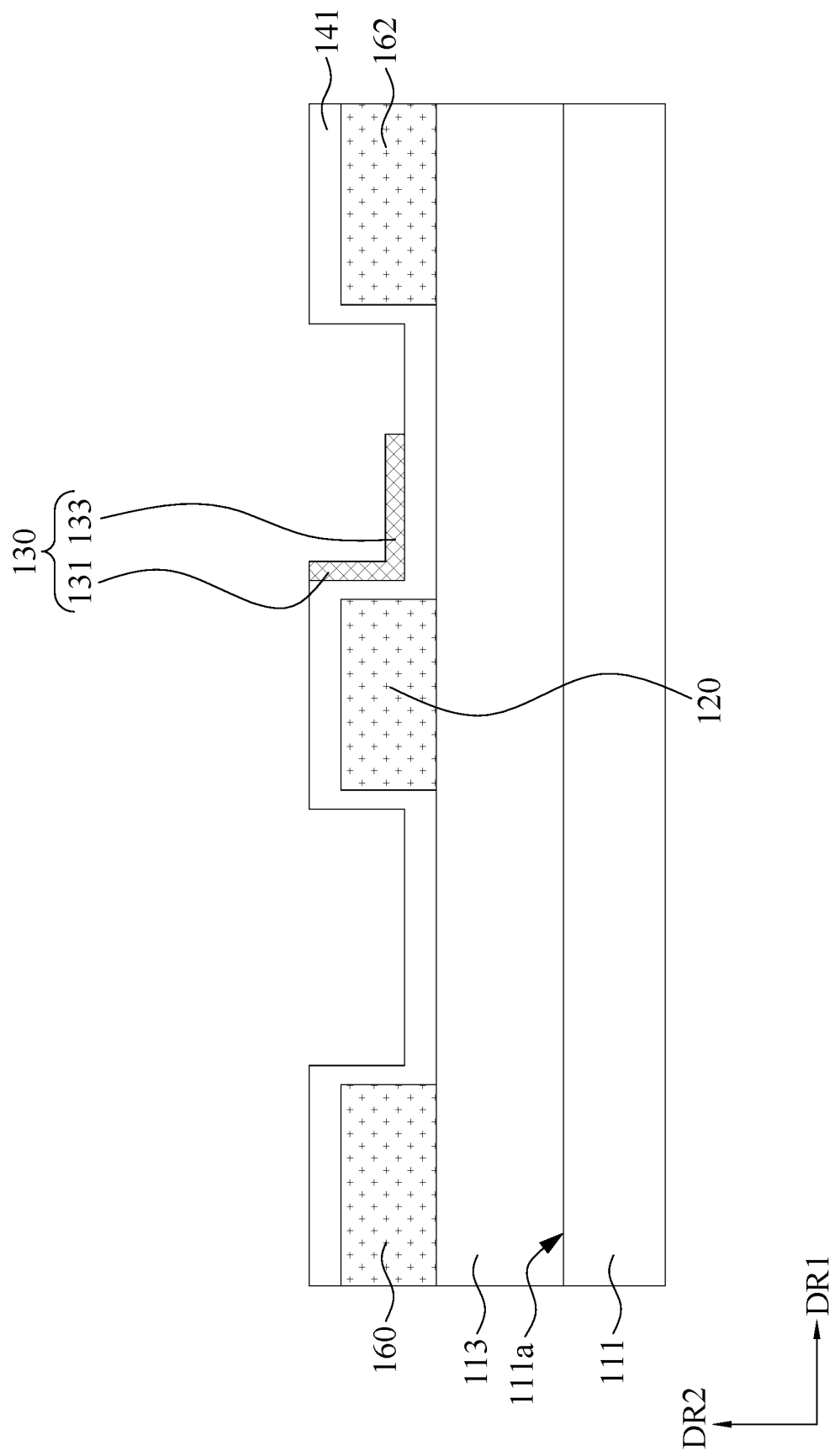

Referring to FIG. 7D, after performing the wet etch process E2, the mask layer 480 may be removed. The mask layer 480 may be removed by applying a cleaning solution. The cleaning solution may include hydrofluoric acid.

The field plate 130 may be formed by performing a dry etch process E1 followed by a wet etch process E2, such that the dry etch process E1 can preliminarily define the approximate shape or pattern of the field plate 130, and then the wet etch process E2 can further smoothen the edge profiles of the field plate 130. Accordingly, the electric field distribution between the gate structure 120 and the drain electrode 162 can be relatively uniform.

The wet etch process E2 may be performed after the approximate shape or pattern of the field plate 130 is defined by the anisotropic dry etch process E1. Since the wet etch process E2 is an isotropic etching process, it can etch away the conductive material layer 430 shown in FIG. 7B from all directions through contact. Thus, the isotropic wet etch process E2 can remove the unwanted portions of the conductive material layer 430 shown in FIG. 7B Thus, the adverse effects caused by undesired leftover conductive material can be prevented effectively.

By adjusting the composition of the etchant and controlling the etching time of the wet etch process E2, the amount of the conductive material layer 430 shown in FIG. 7B can be controlled and adjusted properly. The depth D1 of the recess R1 and the depth D2 of the recess R2 can be controlled and adjusted properly. The field plate 130 can be formed properly. Accordingly, the length L1 of the portion 133 of the filed plate 130 can be adjusted to a desired value. In addition, the length L2 of the portion 135 of the field plate 130 shown in FIG. 1 can be adjusted to a desired value or can be even minimized to zero.

In some other embodiments, the mask layer 480 may include a photoresist material. Patterning processes of a film or layer using a photoresist mask require the film or layer to have a relatively planar structure or a relatively planarized upper surface, in order to define a relatively precise pattern of shape of the film or layer. According to some embodiments of the present disclosure, the mask layer 480 may include a dielectric material, and the wet etch process E2 utilizes the mask layer 480 to pattern the conductive material layer 430 so as to form the field plate 130. Thus, despite that there are relatively large differences in elevations of different portions of the conductive material layer 430, a relatively precise shape or pattern of the field plate 130 can still be formed, and the control over the shape and the size of the field plate 130 can be significantly increased.

Figure 8:
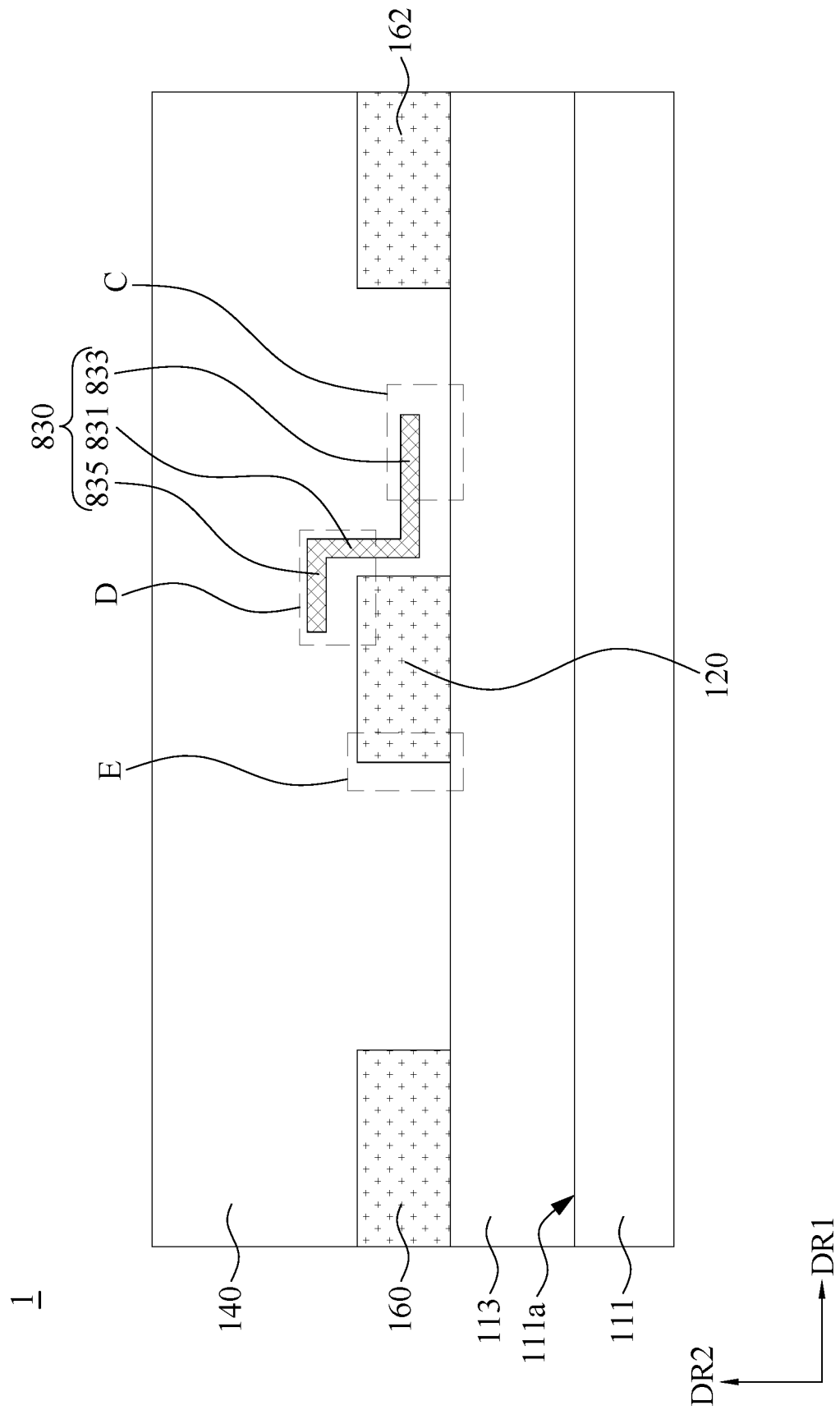
FIG. 8 is a cross-sectional view of a semiconductor device according to some embodiments of the present disclosure.

FIG. 8 is a cross-sectional view of a semiconductor device 1 according to some other embodiments of the present disclosure. The semiconductor device 1 may include a nitride semiconductor layer 111, a nitride semiconductor layer 113, a gate structure 120, a field plate 830, a dielectric structure 140, a source electrode 160, and a drain electrode 162.

The field plate 830 may include a portion 831, a portion 833 connected to the portion 831, and a portion 835 connected to the portion 831. The portion 833 and the portion 835 of the field plate 830 may extend along the direction DR1. The portion 831 of the field plate 830 may extend along the direction DR2. The portion 835 of the field plate 830 may be above the gate structure 120. The field plate 830 may disposed on the nitride semiconductor layer 113 and the gate structure 120.

Figure 9A:
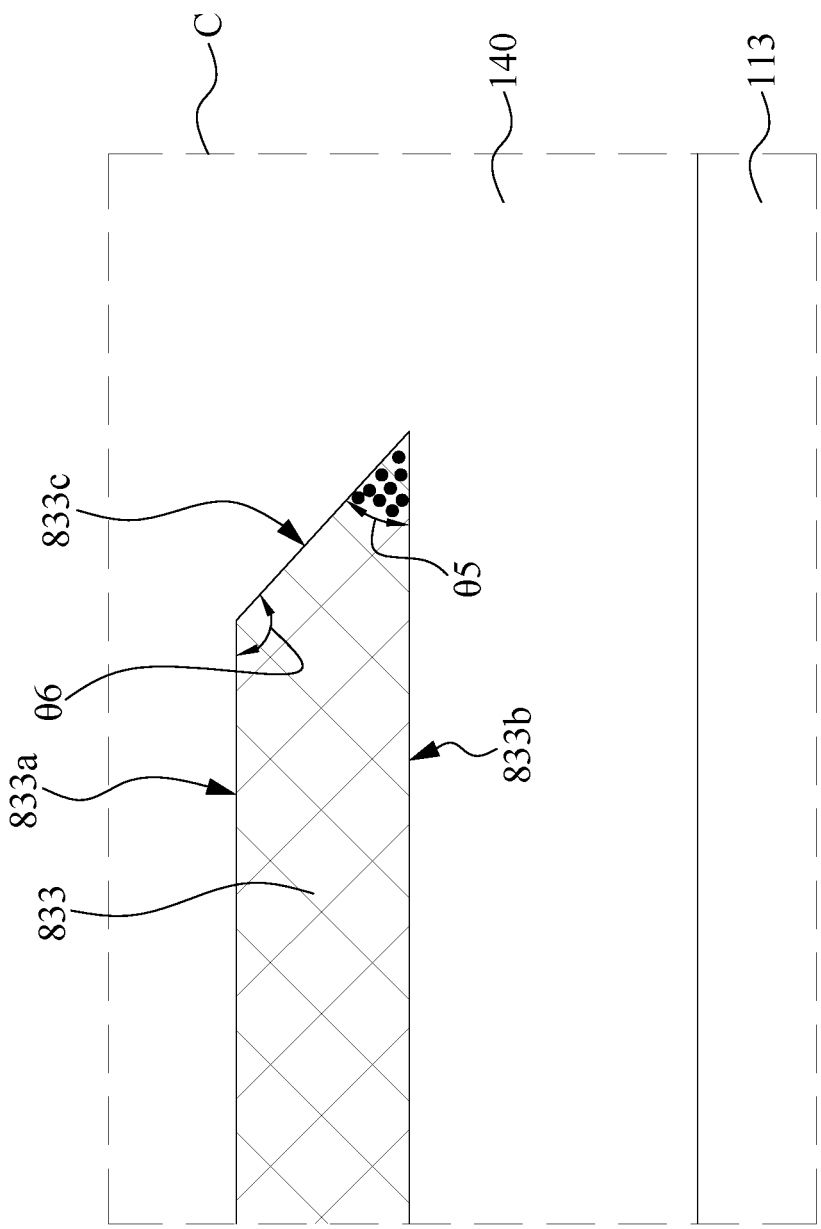
FIG. 9A is an enlarged view of the structure in the box C as shown in FIG. 8 according to some embodiments of the present disclosure.

FIG. 9A is an enlarged view of the structure in the box C as shown in FIG. 8 according to some embodiments of the present disclosure. The portion 833 may have a surface 833a, a surface 833b, and a surface 833c. The surface 833a may be adjacent to the surface 833c. The surface 833b may be adjacent to the surface 833c. The surface 833c may be between the surface 833a and the surface 833b. An angle θ5 between the surface 833b and the surface 833c may be relatively acute. For example, the angle θ5 may be less than 75°. For example, the angle θ5 may be less than 70°. An angle θ6 between the surface 833a and the surface 833c may be relatively obtuse. For example, the angle θ6 may be greater than 105°. For example, the angle θ6 may be greater than 110°. The profile of the portion 833 may be formed because only a dry etch process is performed on the field plate 830. The shape of the portion 833 may be formed because only a dry etch process is performed on the field plate 830. The shape of the portion 833 may be formed because no wet etch process is performed on the field plate 830. Due to an anisotropic and relatively highly directional dry etch process, the angle θ5 between the surface 833b and the surface 833c may be relatively acute. The angle θ5 is relatively small so that the charges may appear, locate or occur adjacent to a point end of the field plate 830. The charges may be accumulated at a sharp edge of the portion 833 of the field plate 830. The charges may be accumulated at a sharp edge of the portion 833 of the field plate 830 to cause a relatively high electric field thereon. Referring to FIG. 9A, charges may be represented by black dots. The charges may be positive charges or negative charges. In the semiconductor device 1, the electric field may not be uniformly distributed between the gate structure 120 and the drain electrode 162. In the semiconductor device 1, the electric field may not be uniformly distributed between the gate structure 120 and the drain electrode 162 when a bias is applied to the drain electrode 162. In the semiconductor device 1, the electric field may not be uniformly distributed between the gate structure 120 and the drain electrode 162 when a bias is applied to the gate structure 120.

Figure 9B:
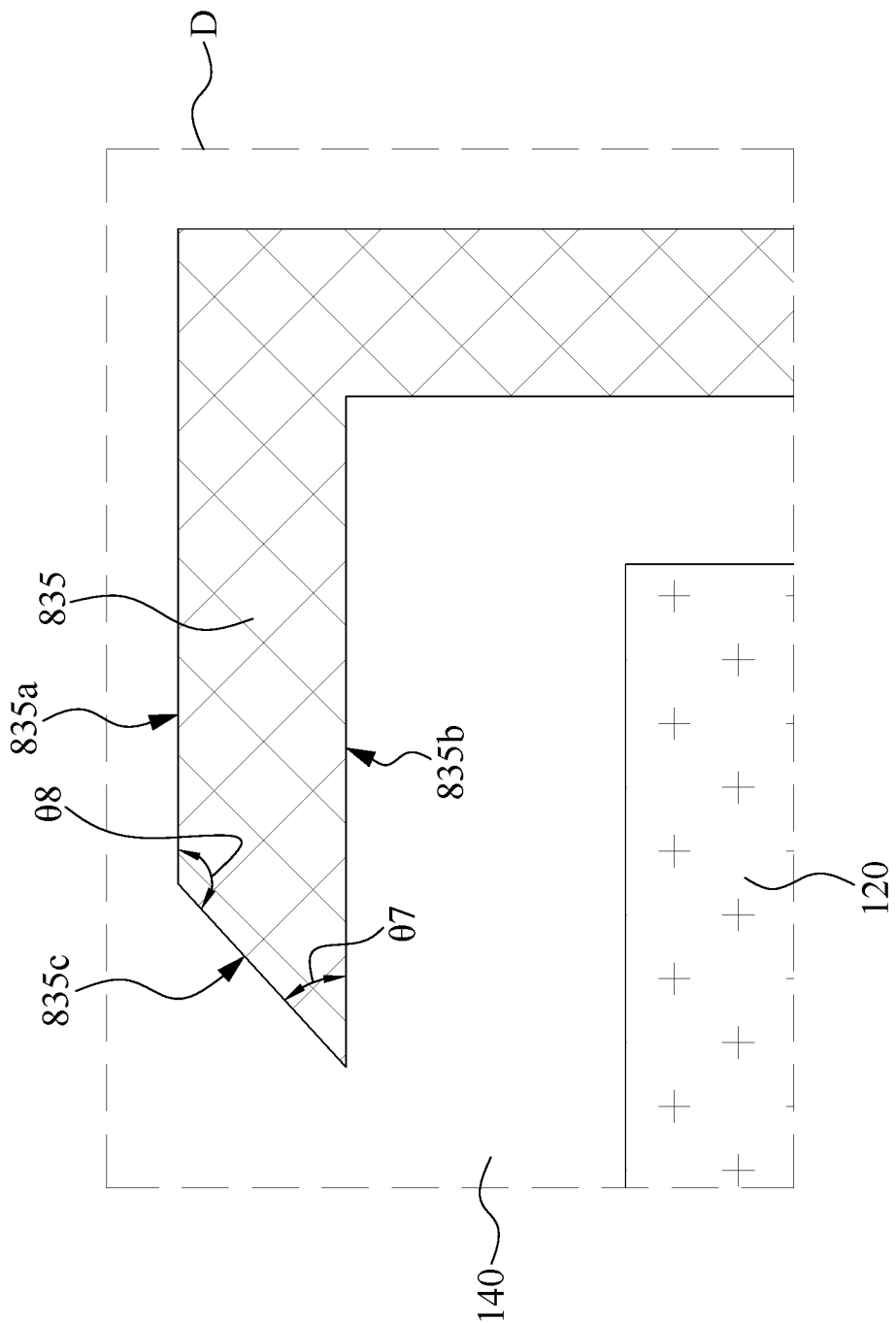
FIG. 9B is an enlarged view of the structure in the box D as shown in FIG. 8 according to some embodiments of the present disclosure.

FIG. 9B is an enlarged view of the structure in the box D as shown in FIG. 8 according to some embodiments of the present disclosure. The portion 835 may have a surface 835a, a surface 835b, and a surface 835c. The surface 835a may be adjacent to the surface 835c. The surface 835b may be adjacent to the surface 835c. The surface 835c may be between the surface 835a and the surface 835b. An angle θ7 between the surface 835b and the surface 835c may be relatively acute. For example, the angle θ7 may be less than 75°. For example, the angle θ7 may be less than 70°. An angle θ8 between the surface 835a and the surface 835c may be relatively obtuse. For example, the angle θ8 may be greater than 105°. For example, the angle θ8 may be greater than 110°. The profile of the portion 835 may be formed because only a dry etch process is performed on the field plate 830. The shape of the portion 835 may be formed because only a dry etch process is performed on the field plate 830. The shape of the portion 835 may be formed because no dry etch process is performed on the field plate 830. Due to an anisotropic and relatively highly directional dry etch process, the angle θ7 between the surface 835b and the surface 835c may be relatively acute. The charges may be accumulated at a sharp edge of the portion 835 of the field plate 830. The charges may be accumulated at a sharp edge of the portion 835 of the field plate 830 to cause a relatively high electric field thereon.

Figure 9C:
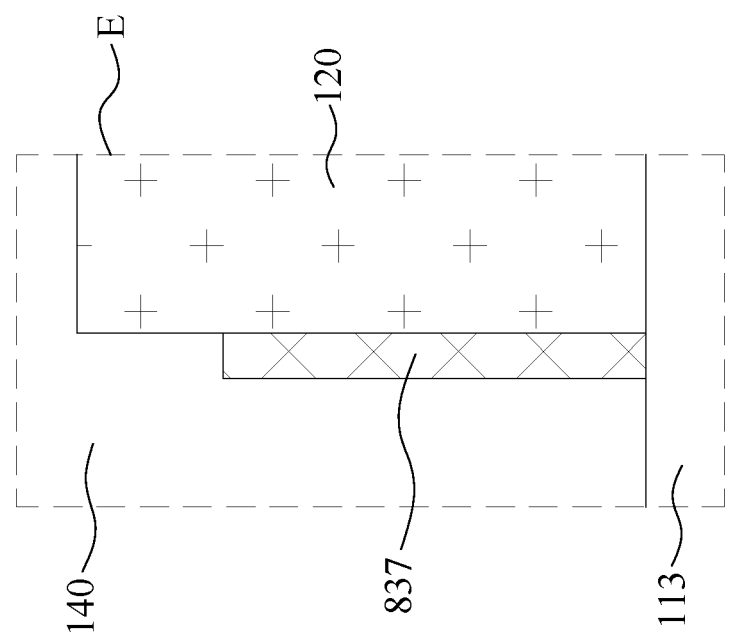
FIG. 9C is an enlarged view of the structure in the box E as shown in FIG. 8 according to some embodiments of the present disclosure.

FIG. 9C is an enlarged view of the structure in the box E as shown in FIG. 8 according to some embodiments of the present disclosure. A portion 837 may be observed. The portion 837 may be observed on the nitride semiconductor layer 113. The portion 837 may be observed on the gate structure 120. The portion 837 may be observed on the sidewall of the gate structure 120. The portion 837 may be observed because only a dry etch process is performed on the field plate 830. Since the field plate 830 is formed by an anisotropic and relatively highly directional dry etch process, the field plate 830 may have a residue. The residue may not be completely etched away. Thus, a portion 837 may be formed on the sidewall of the gate structure 120 of the semiconductor device 1.

As used herein, spatially relative terms, such as "beneath," "below," "lower," "above," "upper," "higher," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately," "substantially," "substantial" and "about" are used to describe and account for small variations. When used in conduction with an event or circumstance, the terms can refer to instances in which the event of circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device, comprising:
   a first nitride semiconductor layer having a first surface;
   a second nitride semiconductor layer formed on the first surface of the first nitride semiconductor layer and having a greater bandgap than that of the first nitride semiconductor layer;
   a gate structure disposed on the second nitride semiconductor layer; and
   a field plate including a first portion extending along a first direction and a second portion extending along a second direction, wherein the first direction is parallel to the first surface of the first nitride semiconductor layer, and the second direction is perpendicular to the first direction, and the first portion is connected to a bottom end of the second portion;
   wherein the first portion has a first surface along the first direction, and a second surface adjacent to the first surface of the first portion, and wherein the first surface of the first portion of the field plate and the second surface of the first portion of the field plate define a first angle ranging between 75°-90°, and the second surface comprises a curved surface;
   wherein the field plate further comprises a third portion extending along the first direction and connected to a top end of the second portion, wherein the third portion partially covers the gate structure from a top view; the third portion of the field plate has a first surface along the first direction, and a second surface adjacent to the first surface of the third portion, and wherein the first surface of the third portion of the field plate and the second surface of the third portion of the field plate define a second angle ranging between 75°-90°; the second surface of the third portion of the field plate comprises a curved surface.

2. The semiconductor device according to claim 1, wherein the second surface of the first portion of the field plate comprises a concave surface.

3. The semiconductor device according to claim 1, wherein the second surface of the third portion of the field plate comprises a concave surface.

4. The semiconductor device according to claim 1, wherein a length of the first portion of the field plate along the first direction is greater than a length of the third portion of the field plate along the first direction.

5. The semiconductor device according to claim 1, wherein the gate structure further comprises:
   a doped group III-V semiconductor layer over the second nitride semiconductor layer; and
   a gate layer over the doped group III-V semiconductor layer, wherein the field plate covers a portion of the doped group III-V semiconductor layer and exposes the gate layer from a top view perspective.

6. The semiconductor device according to claim 1, wherein the gate structure further comprises:
   a doped group III-V semiconductor layer over the second nitride semiconductor layer; and
   a gate layer over the doped group III-V semiconductor layer, wherein the field plate covers a portion of the doped group III-V semiconductor layer and a portion of the gate layer from a top view perspective.

7. The semiconductor device according to claim 6, wherein the field plate further includes a third portion above the gate layer extending along the first direction.

8. A method for fabricating a semiconductor device, comprising:
- forming a first nitride semiconductor layer having a first surface;
- forming a second nitride semiconductor layer on the first surface of the first nitride semiconductor layer, wherein the second nitride semiconductor layer has a greater bandgap than that of the first nitride semiconductor layer;
- forming a gate structure on the second nitride semiconductor layer;
- forming a conductive material layer on the second nitride semiconductor layer and the gate structure;
- forming a mask layer over the conductive material layer; and
- forming a field plate by removing a portion of the conductive material layer, wherein the field plate comprises a first portion extending along a first direction and a second portion extending along a second direction, wherein the first direction is parallel to the first surface of the first nitride semiconductor layer, and the second direction is perpendicular to the first direction, and the first portion is connected to a bottom end of the second portion;
- wherein the first portion has a first surface along the first direction, and a second surface adjacent to the first surface of the first portion, and wherein the first surface of the first portion of the field plate and the second surface of the first portion of the field plate define a first angle ranging between 75°-90°, and the second surface comprises a curved surface;
- wherein the field plate further comprises a third portion extending along the first direction and connected to a top end of the second portion, wherein the third portion partially covers the gate structure from a top view; the third portion of the field plate has a first surface along the first direction, and a second surface adjacent to the first surface of the third portion, and wherein the first surface of the third portion of the field plate and the second surface of the third portion of the field plate define a second angle ranging between 75°-90°; the second surface of the third portion of the field plate comprises a curved surface.

9. The method according to claim 8, wherein removing the portion of the conductive material layer includes performing a dry etch process on the conductive material layer, and after the dry etch process is performed, an edge of the conductive material layer is substantially aligned with an edge of the mask layer along a second direction substantially perpendicular to the first direction.

10. The method according to claim 9, further comprising:
- forming a dielectric structure over the second nitride semiconductor layer, wherein the conductive material layer is formed on the dielectric structure, and the dry etch process has an etching selectivity ratio of the conductive material layer to the dielectric structure that is 1:10 or higher.

11. The method according to claim 9, further comprising: performing a wet etch process on the conductive material layer after performing the dry etch process.

12. The method according to claim 8, wherein removing the portion of the conductive material layer includes performing a wet etch process on the conductive material layer, and after the wet etch process is performed, an edge of the conductive material layer is located inside an edge of the mask layer from a top view perspective.

13. The method according to claim 12, wherein performing the wet etch process including applying an ammonia solution, a hydrogen peroxide solution, or a combination thereof on the conductive material layer.

14. The method according to claim 12, wherein the wet etch process has an etching selectivity ratio of the conductive material layer to the mask layer that is 10:1 or higher.

15. The method according to claim 12, further comprising:
- forming a dielectric structure over the second nitride semiconductor layer, wherein the conductive material layer is formed on the dielectric structure, and the wet etch process has an etching selectivity ratio of the conductive material layer to the dielectric structure that is 10:1 or higher.

16. The method according to claim 12, further comprising:
- removing the mask layer after performing the wet etch process.

* * * * *